(12) United States Patent
Choi (10) Patent No.: US 8,750,044 B2
(45) Date of Patent: Jun. 10, 2014

(54) THREE-DIMENSIONAL NONVOLATILE MEMORY DEVICES

(75) Inventor: Eun Seok Choi, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 34 days.

(21) Appl. No.: 13/599,322

(22) Filed: Aug. 30, 2012

(65) Prior Publication Data

US 2013/0100738 A1 Apr. 25, 2013

(30) Foreign Application Priority Data

Oct. 25, 2011 (KR) .................. 10-2011-0109492

(51) Int. Cl.
*G11C 16/04* (2006.01)
*H01L 29/792* (2006.01)
*H01L 29/66* (2006.01)

(52) U.S. Cl.
USPC ............ 365/185.11; 365/185.01; 365/185.17; 257/324; 257/329; 257/E29.3; 257/E29.309

(58) Field of Classification Search
USPC .................................................. 365/185.11
See application file for complete search history.

(56) References Cited

U.S. PATENT DOCUMENTS

| 8,488,381 | B2 * | 7/2013 | Kim et al. | ............... 365/185.17 |
| 8,564,050 | B2 * | 10/2013 | Park et al. | .................... 257/329 |
| 2012/0051138 | A1 * | 3/2012 | Kim et al. | ............... 365/185.17 |
| 2013/0264631 | A1 * | 10/2013 | Alsmeier et al. | ............. 257/324 |
| 2013/0270625 | A1 * | 10/2013 | Jang et al. | .................... 257/324 |

FOREIGN PATENT DOCUMENTS

| JP | 2010161132 A | 7/2010 |
| KR | 10-2010-0091900 A | 8/2010 |

* cited by examiner

*Primary Examiner* — Son Mai
(74) *Attorney, Agent, or Firm* — William Park & Associates Patent Ltd.

(57) ABSTRACT

A three-dimensional (3-D) nonvolatile memory device includes channel layers protruded from a substrate, word line structures configured to include word lines stacked over the substrate, first junctions and second junctions formed in the substrate between the word line structures adjacent to each other, source lines coupled to the first junctions, respectively, and well pickup lines coupled to the second junctions, respectively.

19 Claims, 12 Drawing Sheets

THREE-DIMENSIONAL NONVOLATILE MEMORY DEVICES

CROSS-REFERENCE TO RELATED APPLICATION

Priority to Korean patent application number 10-2011-0109492 filed on Oct. 25, 2011, the entire disclosure of which is incorporated by reference herein, is claimed.

BACKGROUND

1. Field of Invention

Embodiments of this disclosure generally relate to semiconductor devices and, more particularly, to nonvolatile memory devices having three-dimensional (3-D) structures.

2. Description of Related Art

A nonvolatile memory device retains data stored therein although the supply of power is cut off. As the recent improvement of the degree of integration of 2-D memory devices in which memory cells are formed in a single layer over a silicon substrate reaches the limit, there is proposed a 3-D nonvolatile memory device in which memory cells are vertically stacked on a silicon substrate.

The structure of a known 3-D nonvolatile memory device and problems thereof are described in detail below.

Figure 1A:
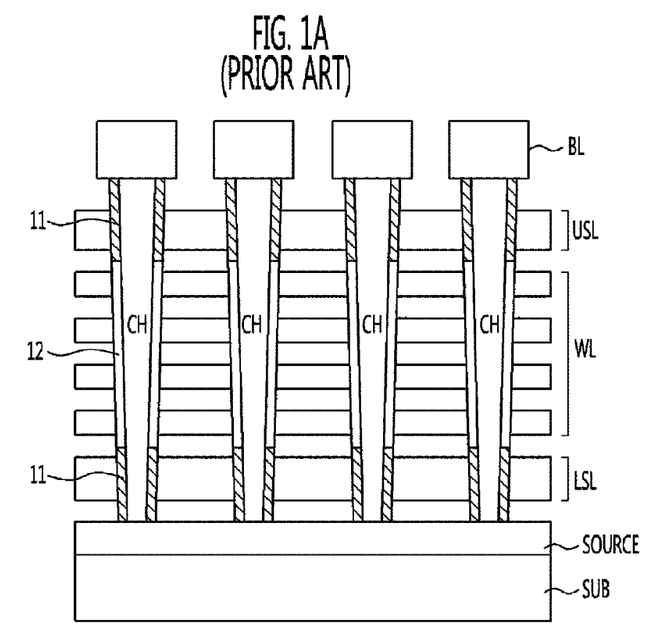
FIGS. 1A to 1C are diagrams illustrating the structure of a known 3-D nonvolatile memory device.
Figure 1B:
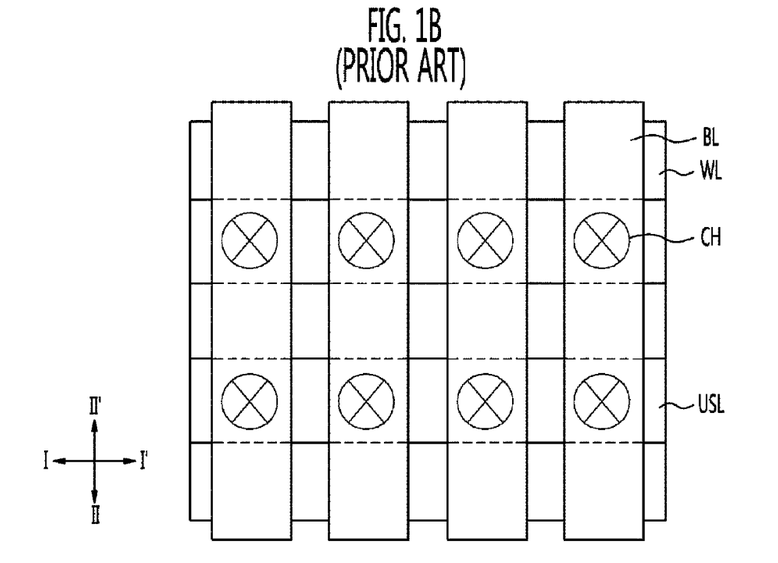
Figure 1C:
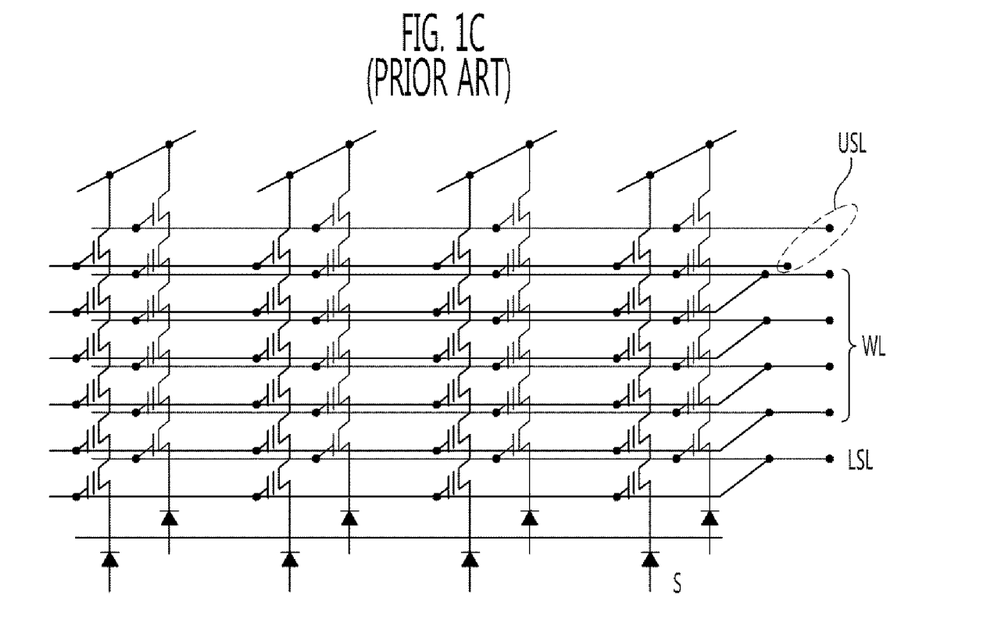

FIGS. 1A and 1C are diagrams illustrating the structure of a known 3-D nonvolatile memory device.

FIG. 1A is a cross-sectional view of the known 3-D nonvolatile memory device, FIG. 1B is a plan view of the known 3-D nonvolatile memory device, and FIG. 1C is a circuit diagram showing the cell array of the known 3-D nonvolatile memory device.

As shown in FIGS. 1A to 1C, the known 3-D nonvolatile memory device includes a plurality of memory cells which are stacked along a plurality of channel layers CH protruded from a substrate SUB.

More particularly, the known 3-D nonvolatile memory device includes a source region SOURCE into which an N type impurity is doped in the substrate SUB. The known 3-D nonvolatile memory device further includes the plurality of channel layers CH protruded from the substrate SUB. The plurality of channel layers CH is arranged in a first direction I-I' and a second direction II-II' that crosses the first direction I-I'. The known 3-D nonvolatile memory device further includes a lower select line LSL, a plurality of word lines WL, and an upper select line USL which are stacked along the channel layers CH. In FIG. 1A, reference numeral 11 denotes a gate insulating layer, and 12 denotes a tunnel insulating layer, a memory layer, and a charge blocking layer. Additionally, BL denotes a bit line, and S denotes a source line.

In this structure, a plurality of the memory cells is coupled in series between an upper select gate and a lower select gate, thus forming one string. The strings are vertically arranged from the substrate SUB.

In this structure, the source region SOURCE has high resistance because it is formed by doping an N type impurity into the substrate SUB. Accordingly, there is a problem in that the driving speed of the memory device is slow.

BRIEF SUMMARY

An embodiment of this disclosure provides a 3-D nonvolatile memory device suitable for improving the driving speed of the memory device by reducing resistance of a source region.

In an aspect, a three-dimensional (3-D) nonvolatile memory device includes channel layers protruded from a substrate, word line structures configured to include word lines stacked over the substrate, first junctions and second junctions formed in the substrate between the word line structures adjacent to each other, source lines coupled to the first junctions, respectively, and well pickup lines coupled to the second junctions, respectively.

DESCRIPTION OF EMBODIMENTS

Hereinafter, various embodiments of the present disclosure will be described in detail with reference to the accompanying drawings. The figures are provided to allow those having ordinary skill in the art to understand the scope of the embodiments of the disclosure.

Figure 2A:
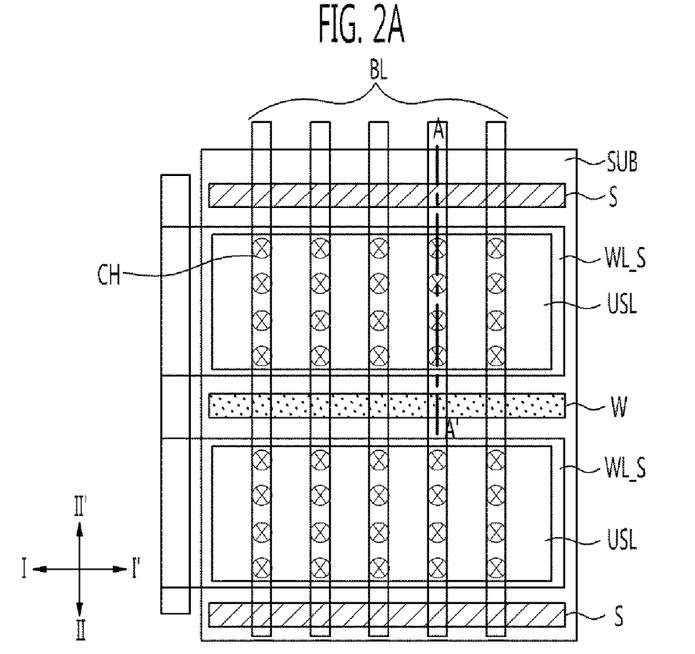
FIGS. 2A and 2B are a plan view and a cross-sectional view illustrating the structure of a 3-D nonvolatile memory device according to an embodiment of this disclosure.
Figure 2B:
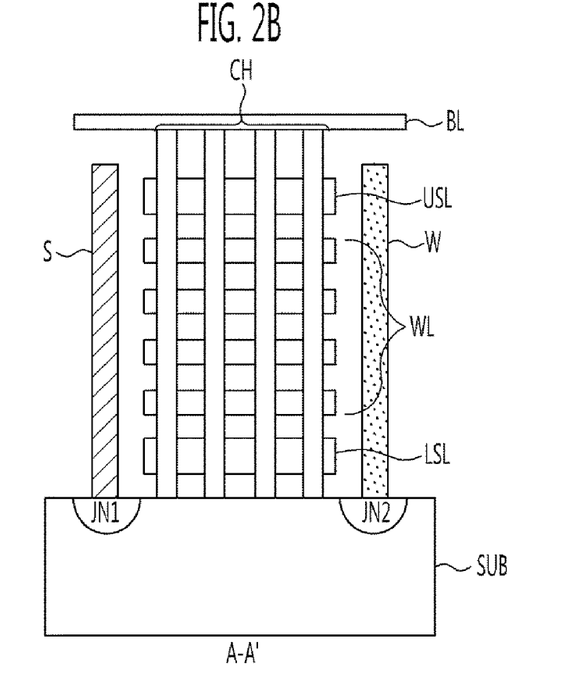

FIGS. 2A and 2B are a plan view and a cross-sectional view illustrating the structure of a 3-D nonvolatile memory device according to an embodiment of this disclosure. FIG. 2B is a cross-sectional view taken along line A-A' of FIG. 2A. Furthermore, FIG. 2B chiefly illustrates gate lines with an interlayer insulating layer omitted, for convenience of description.

As shown in FIGS. 2A and 2B, the 3-D nonvolatile memory device according to an embodiment of this disclosure may include a plurality of channel layers CH protruded from a substrate SUB; word line structures WL_S, each configured to include a plurality of word lines WL configured to substantially surround at least two channel layer columns and stacked over the substrate SUB; a first junction JN1 and a second junction JN2 alternately formed within the substrate SUB between the word line structures WL_S adjacent to each other; source lines S each coupled to the first junction JN1; and well pickup lines W each coupled to the second junction JN2. The 3-D nonvolatile memory device may further include a lower select line LSL formed under each of the word line structures WL_S and an upper select line USL formed over each of the word line structures WL_S. The 3-D nonvolatile memory device may further include a plurality of bit lines BL coupled to the channel layers of upper select gates and substantially extended in parallel with a second direction II-II'.

Here, the plurality of channel layers CH may be arranged in the first direction I-I' and the second direction II-II' that crosses the first direction I-I'. The plurality of channel layers CH arranged in the first direction I-I' may form one channel layer column.

Each of the word line structures WL_S may include a plurality of interlayer insulating layers (not shown) and the plurality of word lines WL which are alternately stacked. The word line structure WL_S further may include a tunnel insulating layer (not shown) configured to substantially surround the channel layer CH, a charge trap layer (not shown) configured to substantially surround the tunnel insulating layer, and a charge blocking layer (not shown) interposed between the charge trap layer and the word lines WL. The word line structure WL_S may be formed to substantially surround at least two channel layer columns. FIG. 2A shows an example in which one word line structure WL_S substantially surrounds four channel layer columns.

The first junction JN1 and the second junction JN2 may be formed within the substrate SUB between the word line structures WL_S and may be configured to include different types of impurities. For example, the first junction JN1 may be a source region into which an N type impurity has been doped, and the second junction JN2 may be a well region into which a P type impurity has been doped. The first junctions JN1 and the second junctions JN2 may be formed in such a manner that the plurality of word line structures WL_S is formed by etching a plurality of conductive layers and a plurality of interlayer insulating layers stacked over the substrate SUB and impurity ions are then implanted into the substrate SUB between the word line structures WL_S.

The source line S may be coupled to the first junction JN1, placed between the word line structures WL_S, and configured to have a form protruded from the substrate SUB. The well pickup line W may be formed of a conductive layer, such as metal.

The well pickup line W may be coupled to the second junction JN2, placed between the word line structures WL_S, and configured to have a form protruded from the substrate SUB. The source line S may be formed of a conductive layer, such as metal.

Figure 3A:
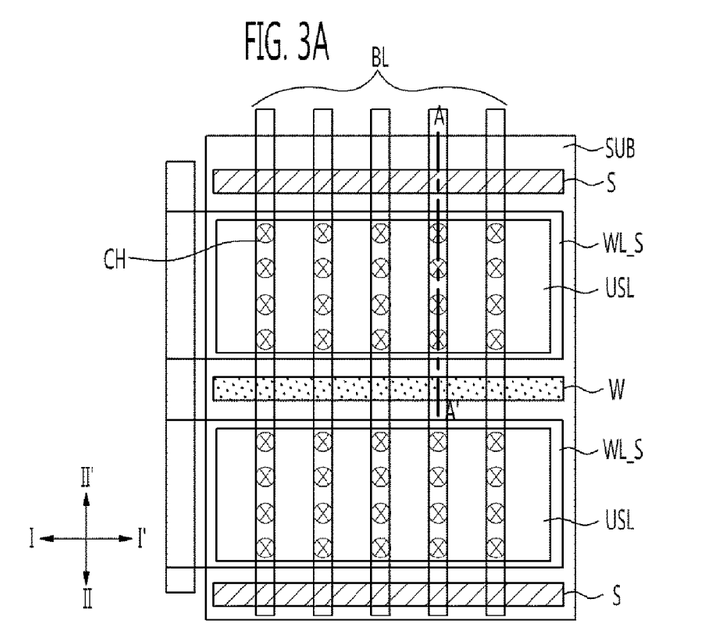
FIGS. 3A and 3B are a plan view and a cross-sectional view illustrating the structure of a 3-D nonvolatile memory device according to an embodiment of this disclosure.
Figure 3B:
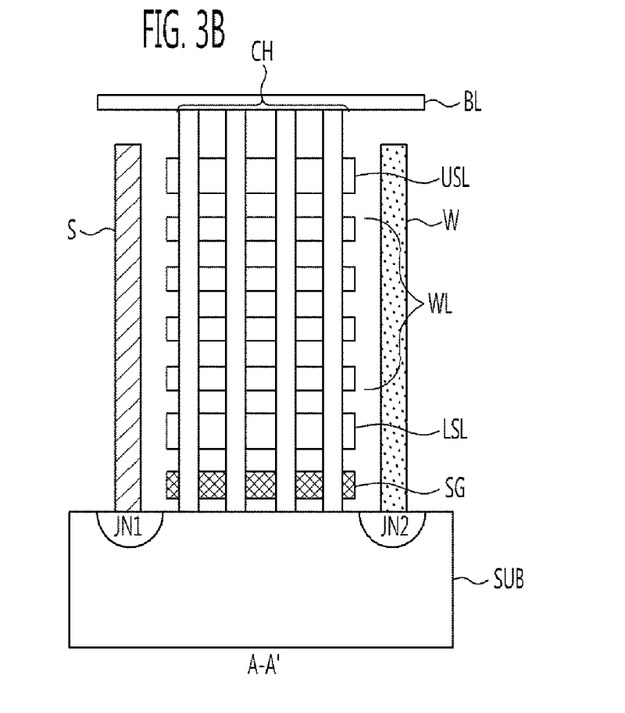

FIGS. 3A and 3B are a plan view and a cross-sectional view illustrating the structure of a 3-D nonvolatile memory device according to an embodiment of this disclosure. FIG. 3B is a cross-sectional view taken along line A-A' of FIG. 3A. Furthermore, FIG. 3B chiefly illustrates gate lines with an interlayer insulating layer omitted, for convenience of description.

As shown in FIGS. 3A and 3B, the 3-D nonvolatile memory device according to an embodiment of this disclosure further includes subgate lines SG formed between word line structures WL_S and a substrate SUB. The remaining elements of the embodiments associated with FIGS. 3A and 3B have the same construction as those of the embodiments associated with FIGS. 2A and 2B, and thus a description thereof is omitted, for simplicity.

In accordance with this disclosure, one word line structure WL_S may be formed to substantially surround at least two channel layer columns. Accordingly, as the number of channel layer columns substantially surrounded by the word line structure WL_S increases, the width of the word line structure WL_S increases. That is, the distance between the first junction JN1 and the second junction JN2 increases. Here, as the distance between the first junction JN1 and the second junction JN2 increases, the threshold voltages of memory cells included in one string may become irregular due to high resistance of the substrate SUB because the substrate SUB has relatively higher resistance than the junction.

For this reason, in the embodiments associated with FIGS. 3A and 3B, the subgate lines SG for controlling the formation of a channel between the first junction JN1 and the second junction JN2 may be formed. Accordingly, by turning on or off the subgate line SG under each string when driving the memory cell, resistance of the channel layer can be reduced and thus the threshold voltages of the memory cells can become regular.

The subgate line SG may be driven under the conditions of Table 1 below.

TABLE 1

|  | READ | PROGRAM | ERASE |
| --- | --- | --- | --- |
| BL '0' | 1 V | 0 V | Floating |
| BL '1' | 0 V | Vcc |  |
| Select WL | Vread | Vpgm | 0 V |
| Unselect WL | Von | Vcc |  |
| Select USL | Vcc | Vcc -> 0 V | Floating |
| Unselect USL | 0 V | Vcc |  |
| Select LSL | Vcc | 0 V |  |
| Unselect LSL | 0 V |  |  |
| SL | 0 V | Vcc | Floating |
| W | 0 V | 0 V | Vers |
| Select SG | Von | Vcc | Floating |
| Unselect SG | 0 V | 0 V | Floating |

In Table 1, the turn-on voltage Von means voltage of a level which can turn on a transistor irrespective of data stored in a memory cell. The read voltage Vread is used to determine data stored in a memory cell. The read voltage Vread means voltage of a level that is turned on when a memory cell is in an erase state and that is turned off when a memory cell is in a programmed state. The pass voltage Vpass is supplied in order to prevent the memory cells of unselected pages from being erroneously programmed. Furthermore, 'Vcc' indicates a power source voltage, 'Vpgm' indicates a program voltage, and 'Vers' indicates an erase voltage.

In accordance with the embodiments associated with FIGS. 3A and 3B, referring to Table 1, in a read operation READ, the turn-on voltage Von may be supplied to a selected subgate line SG and 0 V may be supplied to an unselected subgate line SG. In this case, the selected subgate line SG is turned on, so that an N type channel may be formed in the substrate SUB between the first junction JN1 and the second junction JN2.

In a program operation PROGRAM, the power source voltage Vcc may be supplied to a selected subgate line SG and 0 V may be supplied to an unselected subgate line SG, thereby turning on the subgate line SG. In this case, voltage 0 V of the well pickup line W may be transferred to the substrate SUB between the first junction JN1 and the second junction JN2, so that the substrate SUB may have 0 V.

Thus, the subgate line SG is turned off, and the substrate SUB between the first junction JN1 and the second junction JN2 may be floated.

Furthermore, in an erase operation ERASE, a selected subgate line SG and an unselected subgate line SG may be floated, and the erase voltage Vers may be supplied to the well pickup line W. In this case, a P type channel may be formed in the substrate SUB between the first junction JN1 and the second junction JN2.

Figure 4A:
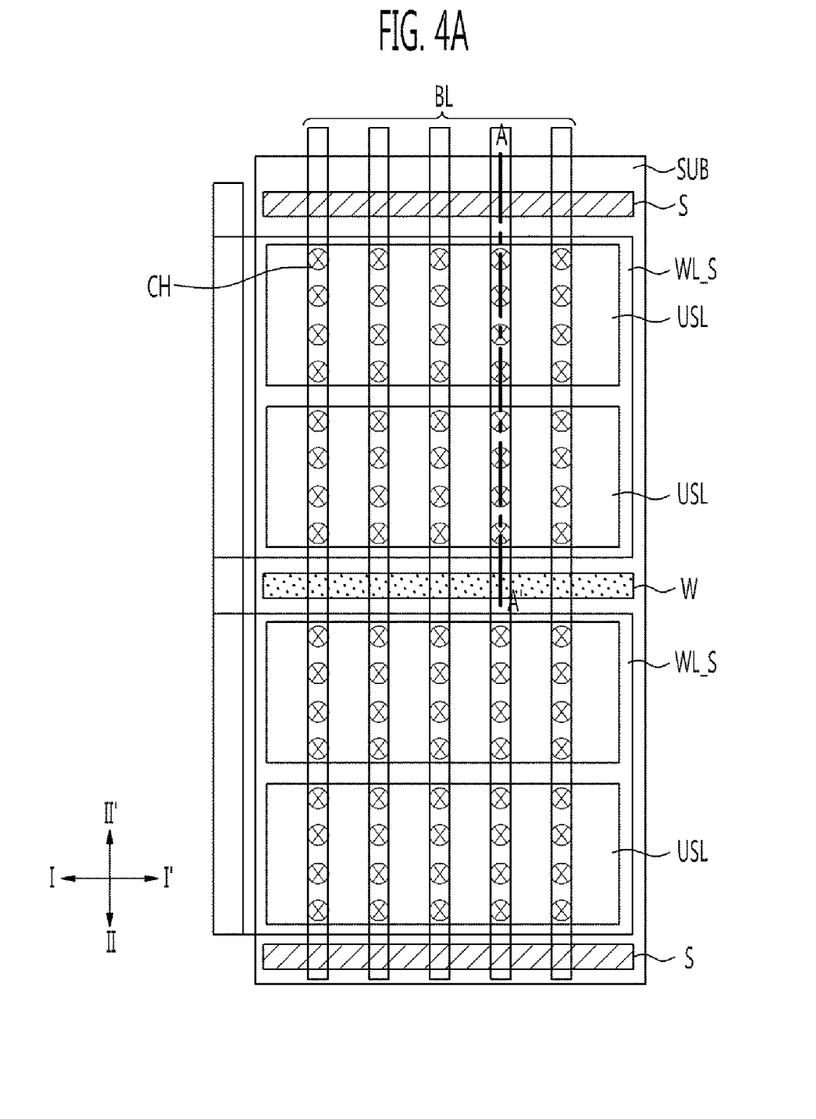
FIGS. 4A and 4B are a plan view and a cross-sectional view illustrating the structure of a 3-D nonvolatile memory device according to an embodiment of this disclosure.
Figure 4B:
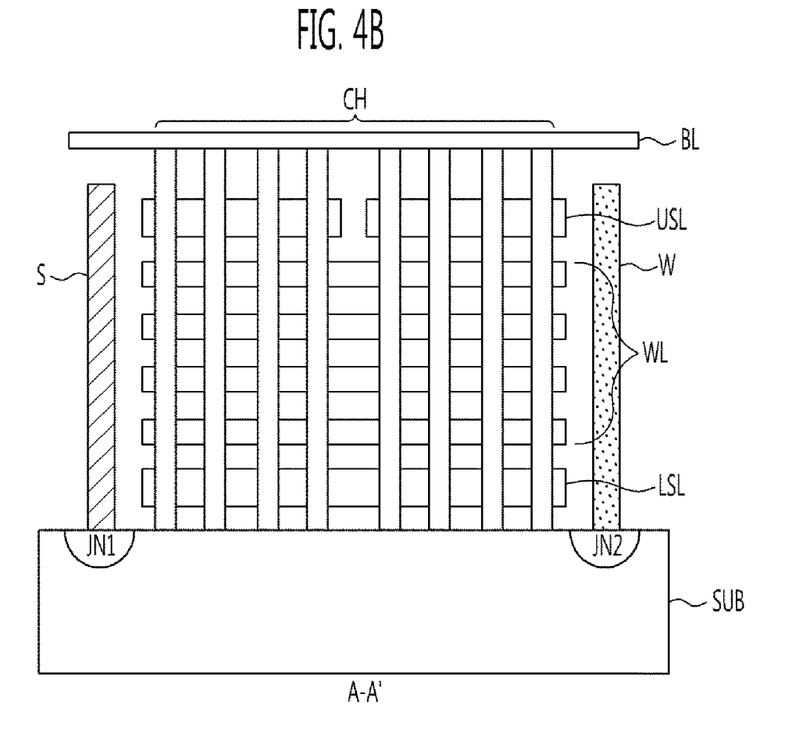

FIGS. 4A and 4B are a plan view and a cross-sectional view illustrating the structure of a 3-D nonvolatile memory device according to an embodiment of this disclosure. FIG. 4B is a cross-sectional view taken along line A-A' of FIG. 4A. Furthermore, FIG. 4B chiefly illustrates gate lines with an interlayer insulating layer omitted, for convenience of description.

As shown in FIGS. 4A and 4B, the 3-D nonvolatile memory device according to an embodiment of this disclosure may include at least one lower select line LSL formed under each word line structure WL_S and at least one upper select line USL formed over the word line structure WL_S. The remaining elements of the embodiments may have the same construction as those of the embodiments associated with FIGS. 2A to 3B.

FIGS. 4A and 4B show an example in which one lower select line LSL may be provided under the word line structure WL_S and two upper select lines USL may be provided over the word line structure WL_S, but not limited thereto. In various embodiments, the number of lower select lines LSL and the number of upper select lines USL may be changed in various ways. For example, a plurality of the lower select lines LSL may be provided under the word line structure WL_S, and a plurality of the upper select lines USL may be provided over the word line structure WL_S.

When a plurality of strings substantially surrounded by one word line structure WL_S is driven by the plurality of upper select lines USL as described above, the memory device can be driven more easily.

Figure 5A:
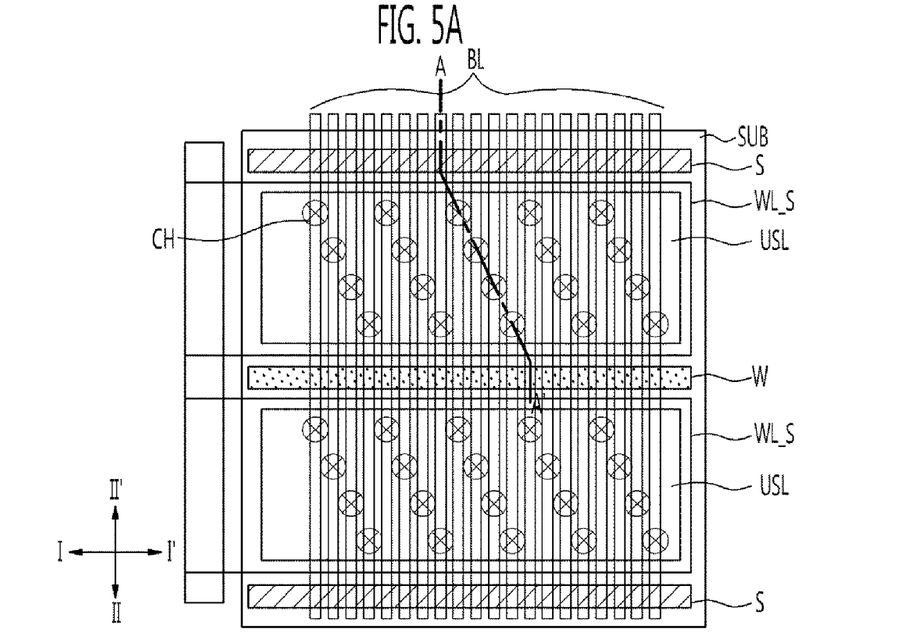
FIGS. 5A and 5B are a plan view and a cross-sectional view illustrating the structure of a 3-D nonvolatile memory device according to an embodiment of this disclosure.
Figure 5B:
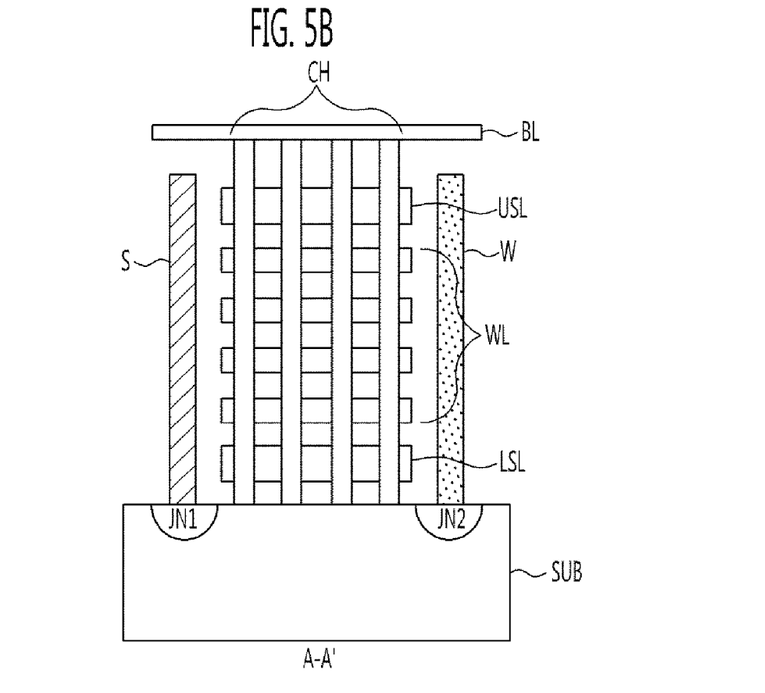

FIGS. 5A and 5B are a plan view and a cross-sectional view illustrating the structure of a 3-D nonvolatile memory device according to an embodiment of this disclosure. FIG. 5B is a cross-sectional view taken along line A-A' of FIG. 5A. Furthermore, FIG. 5B chiefly illustrates gate lines with an interlayer insulating layer omitted, for convenience of description.

In the 3-D nonvolatile memory device according to an embodiment of this disclosure shown in FIGS. 5A and 5B, channel layers CH included in channel layer columns adjacent to each other are arranged in staggered type. The remaining elements of the embodiments may have the same construction as those of the embodiments associated with FIGS. 2A to 4B or may have a combination of those embodiments associated with FIGS. 2A to 4B.

FIG. 5A shows an example in which one word line structure WL_S may include four channel layer columns. Assuming that the four channel layer columns are sequentially called a first channel layer column, a second channel layer column, a third channel layer column, and a fourth channel layer column from the top, channel layers that belong to adjacent channel layer columns, for example, the first channel layer column and the second channel layer column are arranged in staggered type. Accordingly, the channel layers CH that belong to the first to fourth channel layer columns are coupled to different bit lines BL. In this structure, the density of memory cells can be increased because more channel layers are included in the same area as compared with a known art.

Furthermore, in the arrangement of a plurality of the channel layers CH included in each of the word line structures WL_S, all the word line structures WL_S may have substantially the same arrangement, different arrangements, or substantially the same arrangement for each group. In various embodiments, the word line structures WL_S may have a substantially symmetrical arrangement of a mirror type.

Figure 6A:
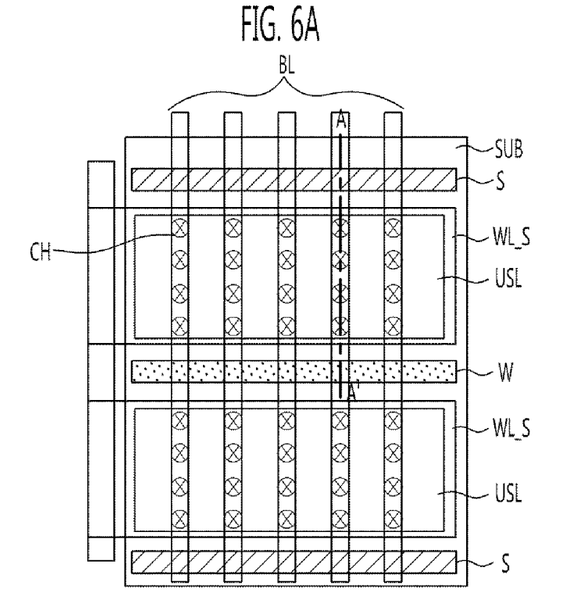
FIGS. 6A and 6B are a plan view and a cross-sectional view illustrating the structure of a 3-D nonvolatile memory device according to an embodiment of this disclosure.
Figure 6B:
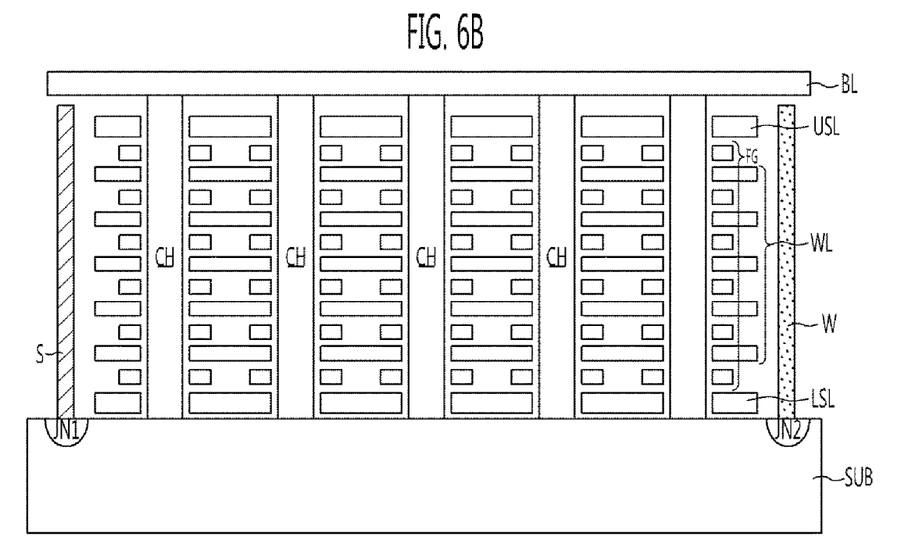

FIGS. 6A and 6B are a plan view and a cross-sectional view illustrating the structure of a 3-D nonvolatile memory device according to an embodiment of this disclosure. FIG. 6B is a cross-sectional view taken along line A-A' of FIG. 6A. Furthermore, FIG. 6B chiefly illustrates gate lines with an interlayer insulating layer omitted, for convenience of description.

As shown in FIGS. 6A and 6B, the 3-D nonvolatile memory device according to an embodiment of this disclosure may include floating gates FG as data repositories for storing data by injecting or discharging electric charges. The remaining elements of these embodiments may have the same construction as those of the embodiments associated with FIGS. 2A to 5B or may have a combination of the embodiments associated with FIGS. 2A to 5B.

Each of the floating gates FG may be interposed between a channel layer and an interlayer insulating layer. Accordingly, each of word line structures WL_S may include a plurality of the floating gates FG and a plurality of word lines WL which may be alternately stacked over a substrate SUB. In this structure, one memory cell may include one floating gate FG and two control gates disposed over and under the floating gate FG, and memory cells adjacent to each other up and down share the control gate. Accordingly, one memory cell may be driven by two control gates. As a result, the influence of interference can be reduced because a memory cell is driven more easily using a low program voltage and a low erase voltage.

Additionally, the degree of integration of memory devices can be effectively improved by combining the embodiments associated with FIGS. 6A and 6B and the embodiments associated with FIGS. 5A and 5B. In general, a 3-D floating gate type nonvolatile memory device using a floating gate as a data repository has a larger cell area than a 3-D trap charge type nonvolatile memory device using a charge trap layer as a data repository. Accordingly, if memory cells including the floating gates FG are formed by combining the embodiments associated with FIGS. 6A and 6B and the embodiments associated with FIGS. 5A and 5B and the channel layers CH included in adjacent channel layer columns are arranged in staggered type, the degree of integration of memory devices can be further improved.

Figure 7A:
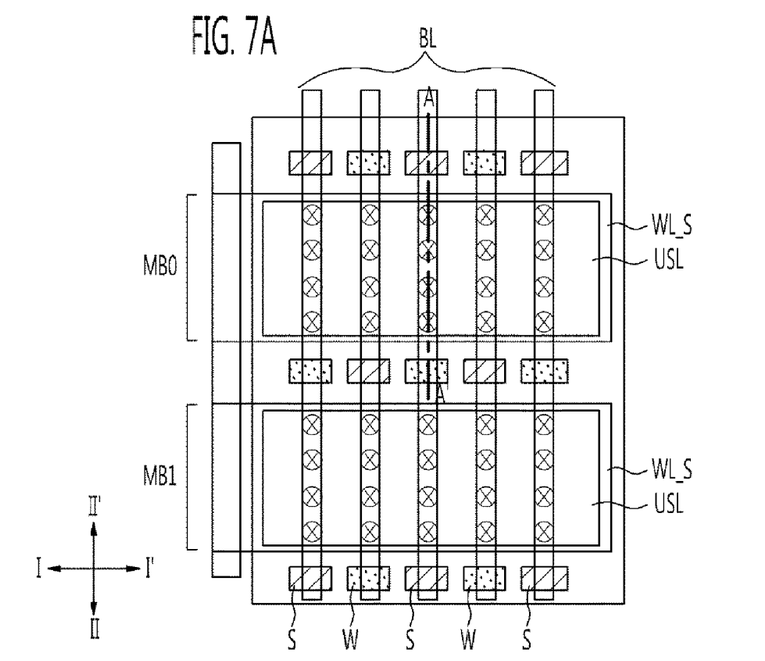
FIGS. 7A and 7B are a plan view and a cross-sectional view illustrating the structure of a 3-D nonvolatile memory device according to an embodiment of this disclosure.
Figure 7B:
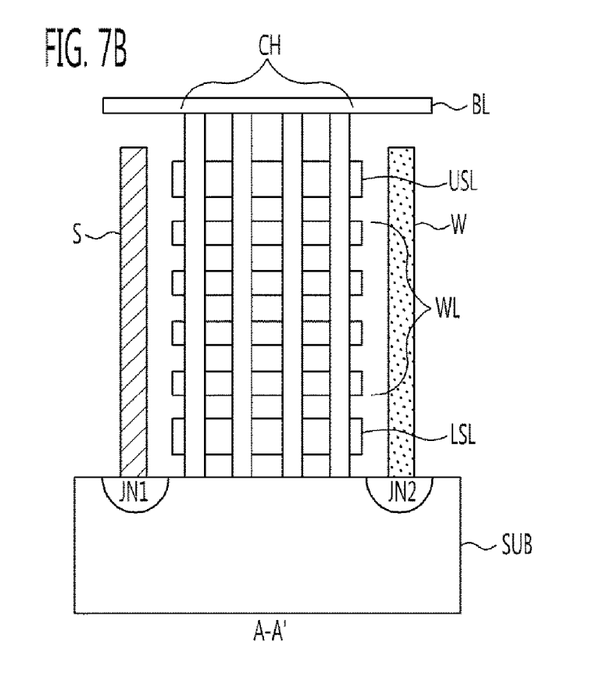

FIGS. 7A and 7B are a plan view and a cross-sectional view illustrating the structure of a 3-D nonvolatile memory device according to an embodiment of this disclosure. FIG. 7B is a cross-sectional view taken along line A-A' of FIG. 7A. Furthermore, FIG. 7B chiefly illustrates gate lines with an interlayer insulating layer omitted, for convenience of description.

As shown in FIGS. 7A and 7B, the 3-D nonvolatile memory device according to an embodiment of this disclosure may include first junctions JN1 and second junctions JN2, each substantially having an island form, between word line structures WL_S. The remaining elements of these embodiments may have the same construction as those of the embodiments associated with FIGS. 2A to 6B or may have a combination of those embodiments associated with 2A to 5B.

In the embodiments associated with FIGS. 2A and 2B, the example in which each of the first junction JN1 and the second junction JN2 has a line form has been described. In contrast, in the embodiments associated with FIGS. 7A and 7B, each of the first junction JN1 and the second junction JN2 may substantially have an island form. Furthermore, the first junction JN1 and the second junction JN2 each substantially having an island form may be isolated from each other and alternately arranged between the word line structures adjacent to each other. The first junction JN1 and the second junction JN2 of the embodiments associated with FIGS. 7A and 7B may be formed by performing primary and secondary ion implantation processes using mask patterns of different forms.

In this structure, a source line S and a well pickup line W coupled to the first junction JN1 and the second junction JN2, respectively, are protruded from a substrate SUB and are alternately arranged substantially in an island form.

For example, the first junction JN1 and the second junction JN2 may be alternately arranged between a first memory block MB0 and a second memory block MB1. Here, the first junctions JN1 and the second junctions JN2 are disposed left and right, respectively, on the basis of the first memory block MB0, and the source lines S and the well pickup lines W corresponding to the first junctions JN1 and the second junctions JN2 are arranged. Accordingly, the source lines S and the well pickup lines W may be alternately arranged on the left and right sides of the first memory block MB0.

Figure 8:
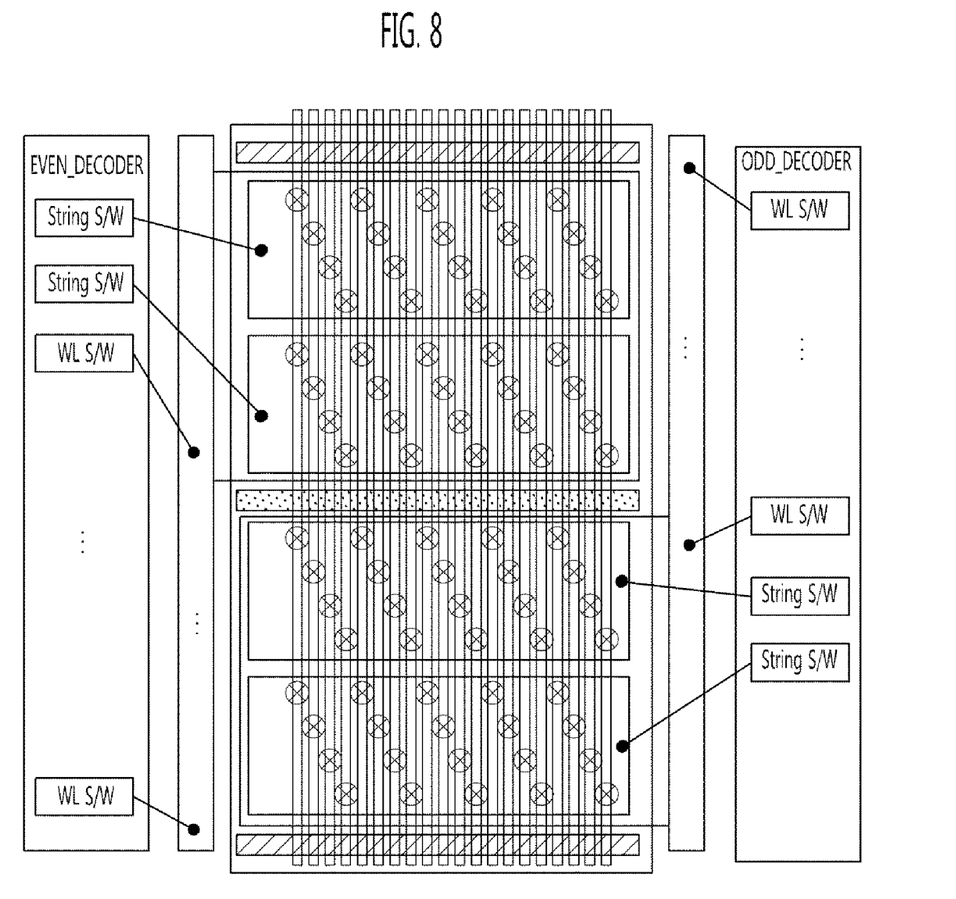
FIG. 8 is a plan view illustrating the structure of a 3-D nonvolatile memory device according to an embodiment of this disclosure.

FIG. 8 is a plan view illustrating the structure of a 3-D nonvolatile memory device according to an embodiment of this disclosure.

As shown in FIG. 8, the 3-D nonvolatile memory device according to an embodiment of this disclosure may include an even block select decoder EVEN_DECODER for selecting even memory blocks and an odd block select decoder ODD_DECODER for selecting odd memory blocks. The remaining elements of these embodiments may have the same construction as those of the embodiments associated with FIGS. 2A to 7B or may have a combination of those embodiments associated with FIGS. 2A to 7B.

Here, the even memory blocks denote even-numbered memory block MB0, MB2, MB4, . . . , (not shown) and the odd memory blocks denote odd-numbered memory blocks MB1, MB3, MB5, . . . (not shown).

the even block select decoder EVEN_DECODER may be coupled to one side of the even memory blocks, and the odd block select decoder ODD_DECODER may be coupled to the other side of the odd memory blocks. That is, the even block select decoder EVEN_DECODER and the odd block select decoder ODD_DECODER may be disposed on the opposite sides on the basis of the memory blocks.

The even block select decoder EVEN_DECODER may select the upper select lines USL and the word lines WL of the even memory blocks and may supply a signal to the selected lines. Accordingly, the even block select decoder EVEN_DECODER may include string select switches String S/W equal to the number of upper select lines USL which are formed over the respective word line structures WL_S. The string select switches String S/W may be coupled to the respective upper select lines USL. Furthermore, the even block select decoder EVEN_DECODER may include word line select switches WL S/W equal to the number of word lines which are included in the word line structures WL_S. The word line select switches WL S/W may be coupled to the respective word lines WL.

The odd block select decoder ODD_DECODER may select the upper select lines USL and the word lines WL of the odd memory blocks and may supply a signal to the selected lines. Thus, the odd block select decoder ODD_DECODER may include string select switches String S/W equal to the number of upper select lines USL which may be formed over the respective word line structures WL_S. The string select switches String S/W may be coupled to the respective upper select lines USL. The odd block select decoder ODD_DECODER further may include word line select switches WL S/W equal to the number of word lines WL which may be included in the word line structures WL_S. The word line select switches WL S/W may be coupled to the respective word lines WL.

In this structure, a signal may be supplied to the word lines WL and the upper select lines USL of one memory block in substantially the same direction.

Figure 9:
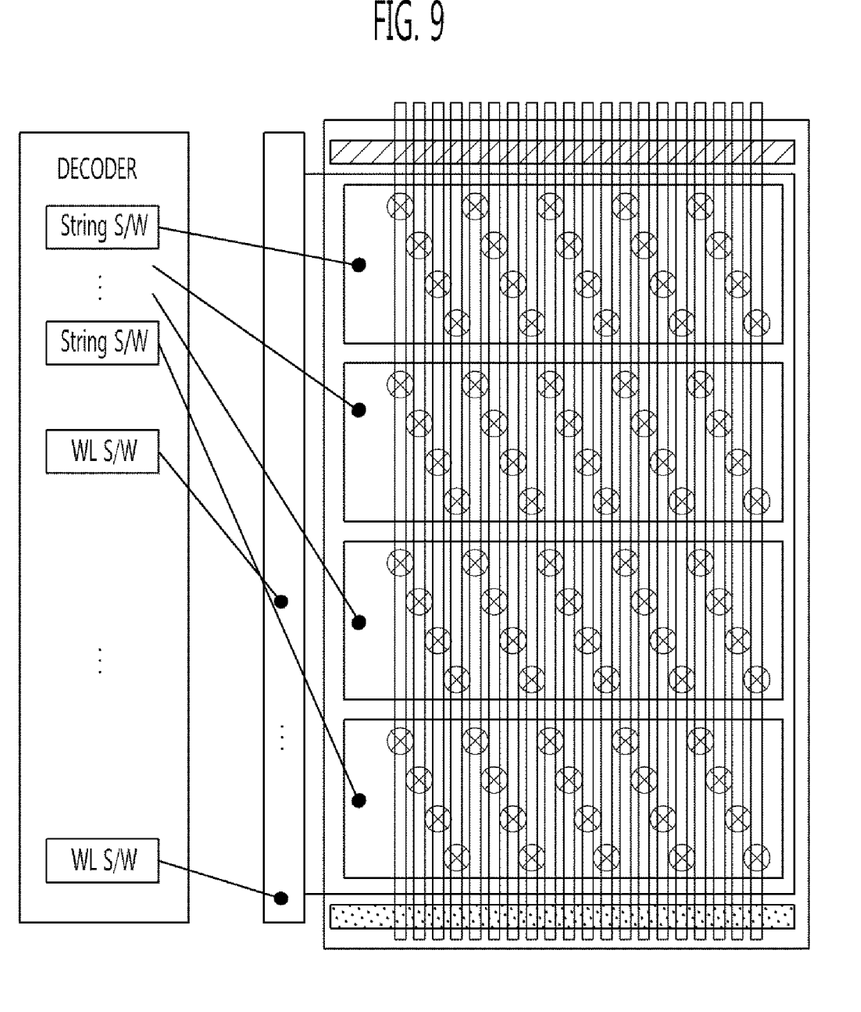
FIG. 9 is a plan view illustrating the structure of a 3-D nonvolatile memory device according to an embodiment of this disclosure.

FIG. 9 is a plan view illustrating the structure of a 3-D nonvolatile memory device according to an embodiment of this disclosure.

As shown in FIG. 9, the 3-D nonvolatile memory device according to the embodiments of this disclosure may include a block select decoder DECODER for selecting memory blocks. The remaining elements of these embodiments may have the same construction as those of the embodiments associated with FIGS. 2A to 7B or may have a combination of those embodiments associated with FIGS. 2A to 7B.

The block select decoder DECODER may be coupled to one side of the memory blocks. Accordingly, in an embodiment, unlike in the embodiments associated with FIG. 8, the block select decoder may be placed only on one side of the memory blocks.

The block select decoder DECODER may select the upper select lines USL and the word lines WL of the memory blocks and may supply a signal to the selected lines. Accordingly, the block select decoder DECODER may include string select switches String S/W equal to the number of upper select lines USL which are formed over respective word line structures WL_S. The string select switches String S/W may be coupled to the respective upper select lines USL. The block select decoder DECODER further may include word line select switches WL S/W equal to the number of word lines WL included in the word line structures WL_S. The word line select switches WL S/W may be coupled to the respective word lines WL.

In this structure, a signal may be supplied to the word lines WL and the upper select lines USL of a plurality of a memory blocks in the same direction. In particular, the block select decoder DECODER may be disposed only on one side of the memory blocks as described above. Thus, if the number of upper select lines USL formed over one word line structure WL_S is small, that is, the number of upper select lines USL included in one memory block, the degree of integration of memory devices can be further improved by using these embodiments.

Figure 10:
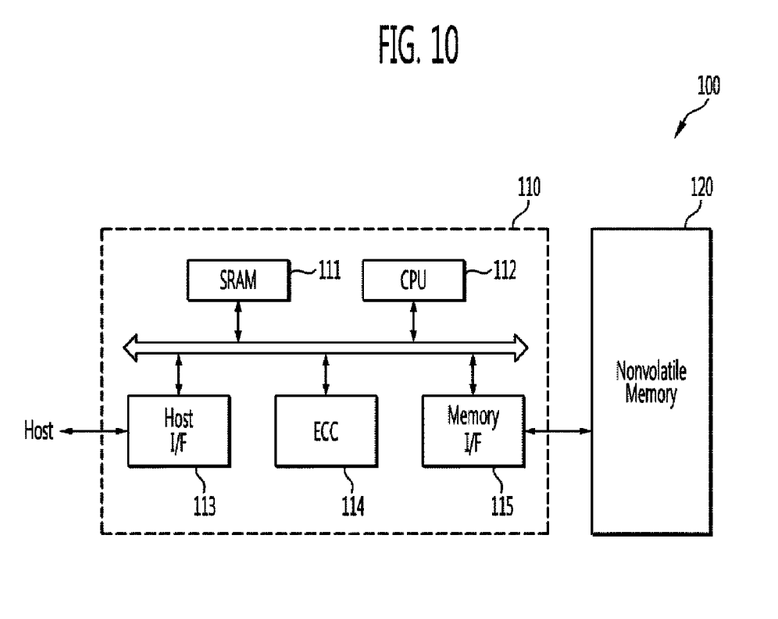
FIG. 10 shows the construction of a memory system according to an embodiment of this disclosure.

FIG. 10 shows the construction of a memory system according to an embodiment of this disclosure.

As shown in FIG. 10, the memory system 100 according to an embodiment of this disclosure may include a nonvolatile memory device 120 and a memory controller 110.

The nonvolatile memory device 120 may be formed to have the above-described cell array. Furthermore, the nonvolatile memory device 120 may be a multi-chip package including a plurality of flash memory chips.

The memory controller 110 is configured to control the nonvolatile memory device 120, and it may include SRAM 111, a Central Processing Unit (CPU) 112, a host interface (I/F) 113, an ECC circuit 114, and a memory interface (I/F) 115. The SRAM 111 is used as the operating memory of the CPU 112. The CPU 112 performs an overall control operation for the data exchange of the memory controller 110. The host I/F 113 is equipped with the data exchange protocol of a host that accesses the memory system 100. Furthermore, the ECC 114 circuit detects and corrects errors included in data read from the nonvolatile memory device 120. The memory I/F 115 performs an interface with the nonvolatile memory device 120. The memory controller 110 may further include RCM for storing code data for an interface with the host.

The memory system 100 configured as described above may be a memory card or a Solid State Disk (SSD) in which the nonvolatile memory device 120 and the controller 110 are combined. For example, if the memory system 100 is an SSD, the memory controller 110 may communicate with the outside (for example, a host) through one of various interface protocols, such as a USB, MMC, PCI-E, SATA, PATA, SCSI, ESDI, and IDE, etc.

Figure 11:
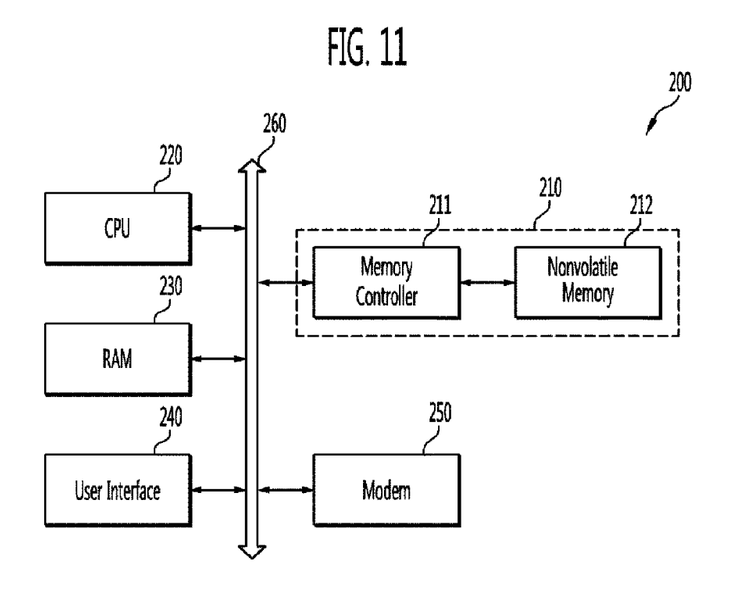
FIG. 11 shows the construction of a computing system according to an embodiment of this disclosure.

FIG. 11 shows the construction of a computing system according to an embodiment of this disclosure.

As shown in FIG. 11, the computing system 200 according to an embodiment of this disclosure may include a CPU 220, RAM 230, a user interface 240, a modem 250, and a memory system 210 all of which are electrically coupled to a system bus 260. If the computing system 200 is a mobile device, the computing system 200 may further include a battery for supplying operating voltages to the computing system 200. The computing system 200 may further include application chipsets, a camera image processor (CIS), mobile DRAM, and so on.

The memory system 210 may include a nonvolatile memory device 212 and a memory controller 211 as described above with reference to FIG. 10.

In accordance with this technology, the first junction and the second junction are alternately disposed within the substrate between adjacent word line structures, and thus the source region and the well region are included in the substrate. In particular, the source line and the well pickup line are protruded from the substrate in a line form and are disposed between adjacent word line structures in such as way to be coupled to the first junction and the second junction, respectively. Resistance of the source line and the well pickup line can be reduced because the source line and the well pickup line are made of metal. As a result, the program speed and the erase speed can be increased.

Furthermore, subgate lines for controlling the formation of a channel layer are included between the first junction and the second junction between the word line structure and the substrate. Accordingly, a distribution of the threshold voltages of memory cells can be improved by reducing resistance of a substrate when a memory device is driven.

What is claimed is:

1. A three-dimensional (3-D) nonvolatile memory device, comprising:
    channel layers protruded from a substrate;
    word line structures configured to comprise word lines stacked over the substrate;
    first junctions and second junctions formed in the substrate between the word line structures adjacent to each other;
    source lines coupled to the first junctions, respectively; and
    well pickup lines coupled to the second junctions, respectively.

2. The 3-D nonvolatile memory device of claim 1, further comprising subgate lines formed between the word line structures, wherein each of the subgate lines controls a formation of a channel between the first junction and the second junction.

3. The 3-D nonvolatile memory device of claim 2, wherein an N type channel is formed in the substrate by turning on a selected subgate line when a read operation is performed.

4. The 3-D nonvolatile memory device of claim 2, wherein a P type channel is formed in the substrate by floating a selected subgate line when an erase operation is performed.

5. The 3-D nonvolatile memory device of claim 1, further comprising:
    at least one lower select line formed under the word line structures; and
    at least one upper select line formed over the word line structures.

6. The 3-D nonvolatile memory device of claim 1, further comprising:
    at least one lower select line formed under one of the word line structures; and
    at least two upper select lines formed over the word line structure.

7. The 3-D nonvolatile memory device of claim 1, wherein channel layers included in adjacent channel layer columns, from among the channel layers, are arranged as a staggered type.

8. The 3-D nonvolatile memory device of claim 1, wherein the word lines included in each of the word line structures substantially surround at least two columns of channel layers.

9. The 3-D nonvolatile memory device of claim 1, wherein:
    the first junctions are source regions into which an N type impurity has been doped, and
    the second junctions are well regions into which a P type impurity has been doped.

10. The 3-D nonvolatile memory device of claim 1, wherein:
    each first junction and second junction is formed in a line form, and
    the first junctions and the second junctions are alternately arranged between the word line structures adjacent to each other.

11. The 3-D nonvolatile memory device of claim 1, wherein:
    each first junction and second junction is formed in an island form, and
    the first junctions and the second junctions are alternately arranged between the word line structures adjacent to each other.

12. The 3-D nonvolatile memory device of claim 1, wherein each source line and well pickup line is disposed between the word line structures adjacent to each other and is protruded from the substrate.

13. The 3-D nonvolatile memory device of claim 1, further comprising:
    an even block select decoder coupled to one side of even memory blocks; and
    an odd block select decoder coupled to an other side of odd memory blocks.

14. The 3-D nonvolatile memory device of claim 13, wherein:
    the even block select decoder selects the word lines of the word line structures included in the even memory blocks and supplies a signal to a selected word line, and
    the odd block select decoder selects the word lines of the word line structures included in the odd memory blocks and supplies a signal to a selected word line.

15. The 3-D nonvolatile memory device of claim 1, further comprising a decoder coupled to one side of memory blocks and configured to select the word lines of the word line structure included in a memory block and supply a signal to a selected word line.

16. The 3-D nonvolatile memory device of claim 1, wherein the word line structures further comprise floating gates alternately stacked with the word lines.

17. The 3-D nonvolatile memory device of claim 1, wherein the word line structures comprise:
    tunnel insulating layers configured to substantially surround respective channel layers;
    charge trap layers configured to substantially surround respective tunnel insulating layers; and
    charge blocking layers interposed between the charge trap layers and the word lines.

18. The 3-D nonvolatile memory device of claim 1, wherein the source lines are formed of a conductive layer.

19. The 3-D nonvolatile memory device of claim 1, wherein the well pickup lines are formed of a conductive layer.

* * * * *